United States Patent [19]

Figueria, Jr.

[11] Patent Number: 5,698,849
[45] Date of Patent: Dec. 16, 1997

[54] OPTICAL ENCODER WITH ALIGNMENT OF SOURCE, DETECTOR, AND MODULATOR

[75] Inventor: Robert J. Figueria, Jr., San Jose, Calif.

[73] Assignee: Siemens Components, Inc., Cupertino, Calif.

[21] Appl. No.: 755,674

[22] Filed: Nov. 25, 1996

Related U.S. Application Data

[63] Continuation of Ser. No. 221,304, Mar. 31, 1994, abandoned.
[51] Int. Cl.⁶ .................................................. G01D 5/34
[52] U.S. Cl. ............................... 250/231.14; 250/231.16
[58] Field of Search .......................... 250/231.13, 231.14, 250/231.15, 231.16, 231.17, 231.18; 341/13, 31

[56] References Cited

U.S. PATENT DOCUMENTS

| | | | |
|---|---|---|---|
| 3,098,152 | 7/1963 | Von Mathes | 250/231.14 |
| 4,132,890 | 1/1979 | Garcia et al. | 250/231.13 |
| 4,184,071 | 1/1980 | Fryer et al. | 250/231.16 |
| 4,218,615 | 8/1980 | Zinn, Jr. | 250/231.16 |
| 4,319,134 | 3/1982 | Weber | 250/231.17 |
| 4,343,992 | 8/1982 | Blaser | 250/231.14 |
| 4,345,149 | 8/1982 | Blaser | 250/231.14 |

*Primary Examiner*—Stephone Allen

[57] ABSTRACT

An optical encoder for a rotating shaft having a radiation source, a radiation detector and a radiation modulator interposed therebetween. The radiation source, the radiation modulator and the radiation detector are positionally configured and mechanically connected to one another and to the shaft in a manner to be in axial and radial alignment with one another relative to the rotating shaft.

27 Claims, 4 Drawing Sheets

OPTICAL ENCODER WITH ALIGNMENT OF SOURCE, DETECTOR, AND MODULATOR

CROSS-REFERENCE TO RELATED APPLICATION

This is a continuation of Ser. No. 08/221,304 filed Mar. 31, 1994, now abandoned.

TECHNICAL FIELD

A related application entitled "A METHOD OF ALIGNING A LIGHT PATHWAY FOR AN OPTICS APPARATUS" by the same inventor, is being filed on the same day herewith and is incorporated by reference herein.

This invention relates to a position sensor or encoder that measures the angular position of a rotating shaft. More particularly, this invention relates to an optical encoder that has a self-aligning optical detection mechanism.

BACKGROUND OF THE INVENTION

Many types of transducers, commonly known as position sensors or encoders, have been used for rotating shaft position measurement. In recent years, encoders that provide direct digital measurement have replaced traditional analog encoders in most applications. Of the digital types, encoders that utilize light beams to resolve the position and movement of shafts, i.e., optical encoders, have found particular acceptance in the marketplace.

Optical encoders configured with only one output can sense shaft movement, but not direction, and are used for tachometer-type applications to determine velocity. Optical encoders configured with two outputs, i.e., incremental encoders, can detect shaft movement and the direction of movement. An incremental encoder may also use a third output, called a zero reference output or an index pulse, to locate a unique angular position of the shaft and thus define a known reference point for starting an operation or process. An optical absolute position encoder, that uses a multiplicity of outputs to form a binary representation of the absolute angular position of the shaft, may also be configured.

Regardless of type and specific mechanical construction, optical encoders generally use the same optical detection mechanism and components: a light source, a light modulator located in the source light pathway, and light detectors that receive the modulated light and generate electrical signals in response thereto. The light source may be, for example, a light-emitting diode (LED), and may emit electromagnetic radiation within the infrared to ultraviolet spectral region. The light modulator is commonly in the form of a thin disk, or thin wheel, concentric with the rotating shaft and having its faces perpendicular to the source light pathway. The light wheel has a pattern of transparent and opaque areas formed on the faces so that as the shaft rotates, the source light passing through the wheel faces is interrupted in accordance with the pattern. The unique light pattern illuminated by the wheel is sensed by the light detectors. In response, the detectors generate electrical signals that interchange between a high voltage level and a low voltage level and that can be graphically represented as continuous time-varying square waves. Optical incremental encoders use one output from one detector to detect the movement of the shaft and use the phase differences of two outputs (generated from separate detectors) to detect the direction of movement of the shaft.

One existing optical incremental encoder for a medical infusion pump system utilizes a discrete optical component, such as an LED, soldered onto a first printed circuit board to act as the light source or light emitter and three additional LEDs soldered onto a second printed circuit board to act as the light detectors. The encoder also has two aperture plates and an encoder wheel arranged in the light pathway. The aperture plates and the encoder wheel split the light from the LED emitter into three parts so that different light signals are detected by the respective LED detectors and three electrical signal outputs are generated. The splitting of the source light enables the generation of the phase and timing output relationships which are used by associated detector circuitry to determine the shaft position and movement and, thus, to control the pump system. The light paths between the LED emitter and the LED detectors are defined by the relative position of the LEDs on the respective boards, the mechanical alignment of the two boards, and the location of the die in each individual LED.

One problem of the existing encoder is that the very small dimensions of the encoder wheel and the wheel pattern permit minor mechanical alignment discrepancies to alter the light paths and, thus, adversely effect the accuracy of the detection of the modulated light. Although the existing encoder uses two alignment screws to tie together the two printed circuit boards and the two aperture plates, there is no direct alignment of the aperture plates, the encoder wheel and the LEDs. Consequently, the light paths between the LED emitter and the LED detectors are subject to misalignment and require frequent calibration. In addition, the existing encoder lacks a single reference point to align the aperture plates, the encoder wheel and the LEDs. Thus, both alignment and calibration of these components is fairly cumbersome, time-consuming and imprecise.

The existing encoder has a further problem with its optical detection mechanism. In particular, the splitting of the source light by the two aperture plates and the encoder wheel results in a significant loss of the amount of light from the LED emitter to the LED detectors. This effects the accuracy as well as the performance of the existing encoder. As a result, the existing encoder requires additional circuitry to compensate for the light loss (e.g., by boosting the detected light signals), adding unnecessary expense and complexity to the device.

Consequently, there is a need to have an optical encoder that has an optical detection mechanism that is substantially free from misalignment and frequent calibration or that is self-aligning. There is also a need to have an optical encoder that utilizes a single reference point to align all the components of the optical detection mechanism. There is also a need for an optical encoder that has an improved light pathway that does not experience significant loss of source light.

SUMMARY OF THE INVENTION

Briefly, the invention provides an encoder for a rotating shaft, comprising a radiation source; a radiation detector; and a radiation modulator interposed between the source and the detector, said source, detector and modulator being aligned directly with one another. The source, the detector and the modulator may be aligned relative to one reference datum, such as, the rotating shaft. Alternatively, the radiation pathway formed between the source, the modulator and the detector may be aligned relative to one reference datum.

Also, the source, the detector and the modulator may be each mechanically coupled to the rotating shaft and the source and the detector mechanically coupled to one another, said couplings fixing the positions of the source, the modulator and the detector relative to one reference datum.

Advantageously, the axial and the rotational alignment provided by the mechanical construction of the encoder fixes all radiation pathways of the encoder relative to a single datum. Most importantly, the single datum used may be the axis of the rotating shaft to be measured. Consequently, the pathways are not subject to alteration from minor mechanical discrepancies despite "navigating" through passages of very small dimensions. Rather, the pathways are constantly maintained during the rotation of the shaft. As a result, the measurement of the shaft is assured to be accurate. In addition, the encoder may be assembled with ease and the encoder elements located in an accurate and repeatable manner without the need for secondary alignment or calibration.

BRIEF DESCRIPTION OF THE DRAWINGS

For a better understanding of the invention, reference is made to the following description of an exemplary embodiment thereof, and to the accompanying drawings, wherein.

DETAILED DESCRIPTION

Figure 1:
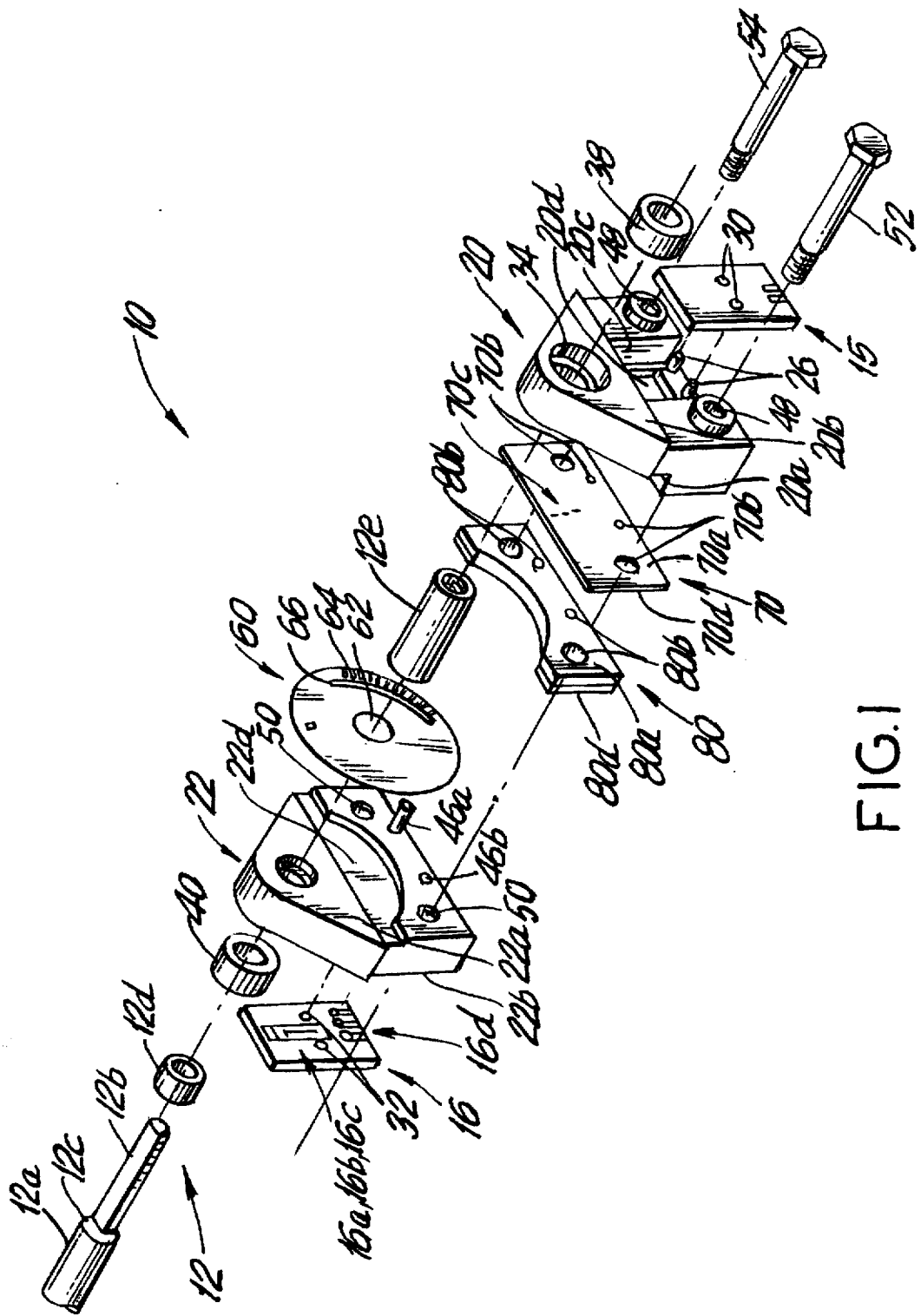
FIG. 1 is an exploded isometric view of an optical encoder constructed in accordance with the present invention.

FIG. 1 is an exploded view of an optical encoder 10 constructed in accordance with the present invention. The encoder 10 is assembled on the end of a rotating shaft 12 that is to be measured. The shaft 12 is part of a motor (not shown) for a machine, such as a medical infusion pump system. As shown, the shaft 12 is a tripartite element having a cylindrical main section 12a that has an end segment 12b with a smaller cross-section than the remainder of the main selection 12a. A raised edge or an annular shoulder 12c is formed on the main section 12a that separates the end segment 12b and the remainder of the main section 12a. The end segment 12b has helical ridges or thread formed on the surface starting at the free end and along a portion of its length.

The tripartite shaft 12 also has a cylindrical collar 12d that is configured to slidably receive the threaded end segment 12b and to abut evenly against the shoulder 12c. The cross-section of the collar 12d is the same as the remainder of the main section 12a so that the exterior surface of the collar 12d continues the surface of the main section 12a upon assembly (see also FIG. 2). The shaft 12 also has a cylindrical half-shaft segment 12e that is approximately the same length as the threaded end segment 12b and that has thread formed on the interior surface to enable the half-shaft 12e to securely engage the thread of the threaded end 12b. The half-shaft 12e also has the same cross-section as the remainder of the main section 12a so that the exterior surfaces of the half-shaft 12e, the collar 12d, and the main section 12a are aligned upon assembly (see also FIG. 2).

Figure 1A:
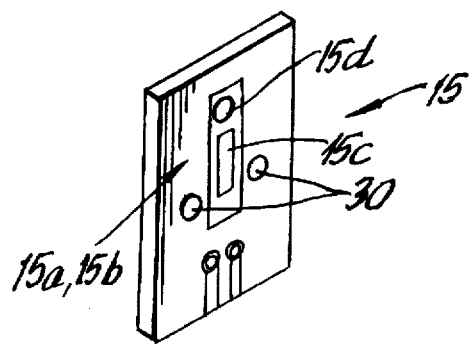
FIG. 1a is a representation of one of the sides of an emitter PCB of the optical encoder of FIG. 1.
Figure 1B:
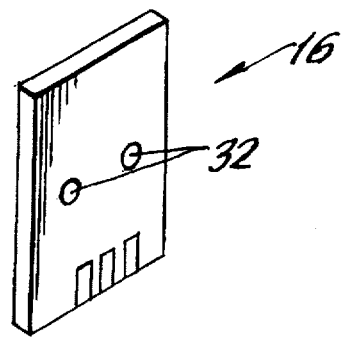
FIG. 1b is a representation of one of the sides of a detector PCB of the optical encoder of FIG. 1.

The encoder 10 comprises two printed circuit boards (PCBs), an emitter PCB 15 and a detector PCB 16. Note that FIGS. 1a and 1b show representations of one of the sides of the emitter PCB 15 and the detector PCB 16, respectively, which are not readily visible from FIG. 1. The emitter PCB 15 has two light source components, such as LEDs 15a, 15b, and associated power and control circuitry, mounted on one of the surfaces. This provides two distinct high-flux-density on-axis radiation patterns. The patterns are then projected into two distinct apertures 20d, 22d that collimate the flux density patterns onto active detection areas 16a, 16b. This creates two isolated detector channels. The two LEDs 15a, 15b serve as the light source for the encoder 10 as described in detail below and may emit low-power near-infrared radiation. The emitter PCB 15 also has a single cylindrical lens 15c molded therein to focus the light of the first LED 15a and a single spherical lens 15d molded therein to focus the light of the second LED 15b. Thus, only the die of each LED 15a, 15b is required to be mounted on the emitter PCB 15. However, a commercially-available LED, already packaged with a lens to focus emitted radiation, may also be used in lieu of an LED die and molded lens combination. The LEDs 15a, 15b, the LED lens 15c, 15d, and the associated power and control circuitry may also be incorporated into a single integrated circuit chip that is mounted on the emitter PCB 15.

The detector PCB 16 has three light sensitive components, such as photodiodes 16a, 16b, 16c, and associated power and control circuitry mounted on one of the surfaces. Each photodiode 16a, 16b, 16c is part of a receiver circuit 16d, also mounted on the detector PCB 16 surface, that produces an electrical signal as described in detail below. The photodiodes 16a, 16b, 16c are designed to detect the radiation emitted by the two LEDs 15a, 15b of the emitter PCB 15. Commercially-available photodiodes may also be used. The photodiodes 16a, 16b, 16c, the receiver circuit 16d, and the associated power and control circuitry may also be incorporated into a single integrated circuit chip that is mounted on the detector PCB 16.

The emitter PCB 15 and the detector PCB 16 are configured to be received and held by an emitter optic block 20 and a detector optic block 22, respectively. Each optic block 20, 22 is made of a hard material, such as plastic, and may be shaped as desired. As shown in the figure, the optic blocks 20, 22 generally have two major surfaces, an inner face 20a, 22a and an outer face 20b, 22b.

The emitter optic block 20 has an indentation 20c formed at a first end on the outer face 20b that is configured to receive a portion of the emitter PCB 15. Similarly, the detector optic block 22 has an indentation 22c formed at a first end on the outer face 22b that is configured to receive a portion of the detector PCB 16. The emitter PCB 15 and the detector PCB 16 are positioned within the optic blocks 20, 22 so that the LEDs 15a, 15b of the emitter PCB 15 and the photodiodes 16a, 16b, 16c of the detector PCB 16 each face a light passage 20d, 22d formed through the respective block that passes from a portion of the back wall of the indentation 20c, 22c to the inner face 20a, 22a. As detailed below, the light passages 20d, 22d are part of a pathway between the light components of the two PCBs that is established upon assembly of the encoder 10.

The light passages 20d, 22d need not be configured as openings formed through the optic blocks 20, 22. Instead, the optic blocks 20, 22 may be constructed of a bandpass filter material that permits passage of only certain wavelengths of radiation and for all other radiation is opaque. In this way, the blocks can filter ambient radiation and transmit only the radiation emitted by the LEDs 15a, 15b. The blocks 20, 22 may be constructed in whole or in part of such a material. Thus, the sections of the optic blocks 20, 22 that form part of the light pathway for the encoder 10 are deemed "light passages".

The emitter PCB 15 and the detector PCB 16 are held by the respective optic block via a pair of PCB alignment pins 26, 28 that are integrally formed on the back wall of each indentation 20c, 22c. Each pair of PCB alignment pins 26, 28 protrudes for a predetermined length at approximately a right angle from the outer face 20b, 22b of the respective optic block. The PCB alignment pins 26, 28 are configured to be inserted into corresponding alignment openings 30, 32 formed on the PCBs, for example, via heat staking, so that the PCBs 15, 16 are securely fastened to the optic blocks 20, 22.

Figure 1D:
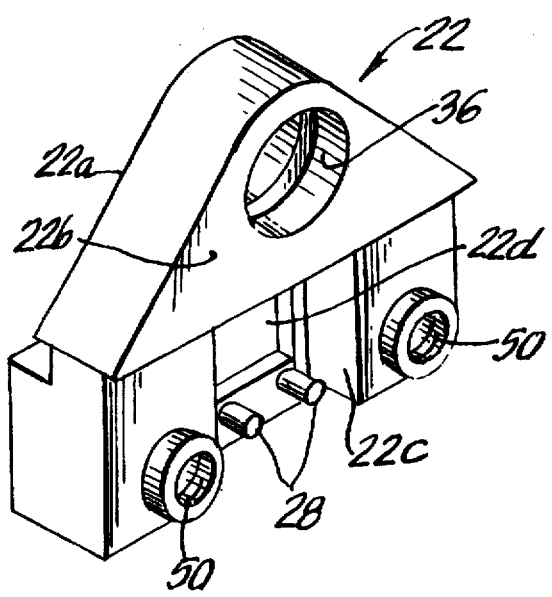
FIG. 1d is an isometric view of the outer face of one of the optic blocks of the optical encoder of FIG. 1.
Figure 1C:
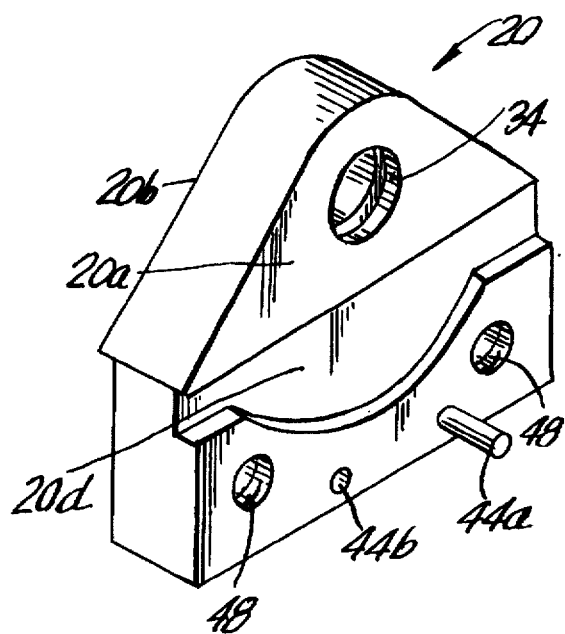
FIG. 1c is an isometric view of the inner face of one of the optic blocks of the optical encoder of FIG. 1.

Each of the optic blocks 20, 22 is configured at a second end to have a shaft passage 34, 36 formed therethrough that passes from the outer face 20b, 22b to the inner face 20a, 22a of the block. Note that FIGS. 1c and 1d show the inner face 20a of the emitter optic block 20 and the outer face 22b of the detector optic block 22, respectively, which are not readily visible from FIG. 1. The shaft passages 34, 36 are configured to hold fixedly therein respective precision linings or bushings 38, 40. The precision bushings 38, 40 are, in turn, configured to receive and hold the assembled tripartite shaft 12 upon insertion of the shaft 12 through the bushings 38, 40 (and through the shaft passages 34, 36). The bushings 38, 40 may be made of any material that is wear-resistant and has a low coefficient of friction, such as metal. Note that the lengthwise axes of the PCB alignment pins 26, 28 are set to be parallel to the center line of the respective shaft passage 34, 36.

The optic blocks 20, 22 are configured to be mated to one another via a pin-hole arrangement. Each optic block has integrally formed at the first end of the inner face a block alignment pin 44a, 46a and a block alignment hole 44b, 46b. Each block alignment pin 44a, 46a protrudes for a predetermined length at approximately a right angle from the respective inner face 20a, 22a and has a lengthwise axis parallel to the center line of the respective shaft passage 34, 36. Each block alignment hole 44b, 46b is configured to securely receive and hold therein the block alignment pin 44a, 46a of the other optic block.

The block alignment pins 44a, 46a and block alignment holes 44b, 46b are formed at predetermined locations on the inner faces 20a, 22a relative to the center lines of the shaft passages 34, 36 (and, thus, to the axis of the shaft 12 inserted therethrough). Moreover, the block alignment pins 44a, 46a and block alignment holes 44b, 46b are formed at corresponding locations on the respective inner faces 20a, 22a. This permits the two optic blocks 20, 22 to be aligned and mated together by the block alignment pin of one block being securely received and held by the corresponding block alignment hole of the other block upon assembly of the encoder 10.

Each of the optic blocks 20, 22 is also configured at the first end to have a pair of threaded apertures 48, 50 formed therethrough that pass from the outer face to the inner face, each aperture of a pair being formed on a different side of the indentation 20c, 22c. The threaded apertures 48, 50 are formed at corresponding locations on the respective blocks. In addition, the threaded apertures 48, 50 are sized and shaped to receive a retainment screw 52, 54 (each screw being receivable by an aperture of one block and the corresponding aperture of the other block) that securely connects the two optic blocks 20, 22 together.

The encoder 10 also comprises a thin disk 60 called an encoder wheel that has a central opening 62 formed therethrough configured to securely receive and hold the tripartite shaft 12 therein. The encoder wheel also has a series of long, narrow openings or slots 64 formed therethrough along a portion of the circumference (see also FIG. 3). The long slots 64 extend for a predetermined distance in radial fashion from the circumference toward the central opening 62. Each long slot 64 is formed a predetermined distance from each adjacent long slot, e.g., approximately 0.75 degrees. The encoder wheel 60 also has a long curved slot 66 formed therethrough between the central opening 62 and the ends of the long slots 64 closest to the central opening 62 (see also FIG. 3). Note that the curved slot 66 is configured as an arc of a circular line concentric with the central opening 62 and has a length approximately the same as the length formed by the series of ends of the long slots 64 closest to the central opening 62.

The long slots 64 and the curved slot 66 are positioned on the encoder wheel 60 to form a predetermined pattern of transparent and opaque areas. The pattern of transparent and opaque areas serve to modulate the radiation emitted from LEDs 15a and 15b. The diameter of the encoder wheel 60 is such that the long slots 64 and the curved slot 66 both pass within, and form part of, the light pathway between the two PCBs 15, 16 that is established upon assembly of the encoder 10. The encoder wheel 60 may be of any hard, non-light reflective material and has a cross-sectional area determined by the particular application.

The encoder 10 uses a thin aperture plate 70 that is configured to have a first face 70a thereof abut evenly against the first end of the inner face 20a of the emitter optic block 20. This is accomplished by plate openings 70b formed through the plate that are sized and shaped to slidably receive the two block alignment pins 44a, 46a and the two retainment screws 52, 54. The aperture plate 70 also has three apertures 70c formed therethrough that are located adjacent to the light passage 20d of the emitter optic block 20. The apertures 70c pass within, and form a part of, the light pathway between the two PCBs 15, 16 that is established upon the assembly of the encoder 10. The apertures collimate the light from PCB 15, so that aperture plate 70 serves as a light collimator. The aperture plate 70 may be of any hard, non-light reflective material and has a cross-sectional area determined by the particular application.

The second face 70d of the aperture plate 70 abuts evenly against a first face 80a of a spacer block 80 which, similar to the aperture plate 70, has block openings 80b formed therethrough that are sized and shaped to slidably receive the two block alignment pins 44a, 46a and the two retainment screws 52, 54. This also permits a second face 80d of the spacer block 80 to abut evenly against the first end of the inner face 22a of the detector optic block 22. Unlike the aperture plate 70, however, the spacer block 80 is not configured to be adjacent to the light passage 22d of the detector optic block 22 and, thus, the spacer block 80 is not in the light pathway between the two PCBs 15, 16. The spacer block 80 may be made of any hard material, such as plastic, and has a cross-sectional area determined by the particular application.

Figure 2:
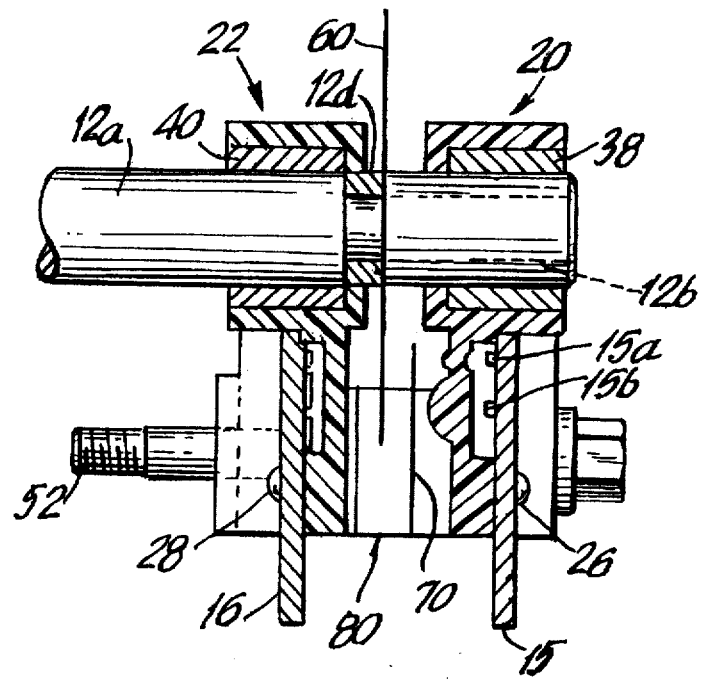
FIG. 2 is a cut-away side view of the optical encoder of FIG. 1.

FIG. 2 is a cut-away side view of the assembled encoder 10. As detailed above, the assembled tripartite shaft 12 is received and held by the precision bushings 38, 40 in the shaft passages 34, 36 of the optic blocks 20, 22. The threaded end segment 12b of the tripartite shaft 12 is covered by the collar 12d, which abuts evenly against the shoulder 12c of the main section 12a. Adjacent the collar 12d, the encoder wheel 60 securely receives and hold the threaded end segment 12b within the central opening 62. The half-shaft 12e, which is threaded with the end segment 12b, holds both the encoder wheel 60 and the collar 12d in place against the annular shoulder 12c. This arrangement causes the encoder wheel 60 to rotate synchronously with the shaft 12 at the same speed and direction without slippage or the like.

The precision bushings 38, 40 provide a tight fitting of the shaft 12 within the shaft passages 34, 36, allowing only a few thousandths of an inch of clearance between the shaft 12 and the bushings' surfaces. This aligns and maintains the center lines of the respective shaft passages 34, 36 coincident with the center line of the shaft 12. Moreover, this creates and maintains a constant axial alignment (relative to the shaft 12) among the encoder wheel 60 and the two optic blocks 20, 22. As a result, the positions of the encoder wheel 60 and the optic blocks 20, 22 (and the light components mounted thereon) are substantially unaffected by any movement or vibration of the shaft 12.

The PCB alignment pins 26, 28 securely fasten the two PCBs 15, 16 to the respective optic blocks 20, 22 within the indentations by engaging the alignment openings 30, 32 formed on the PCBs. In addition, the PCB alignment pins 26, 28 positionally fix the LEDs 15a, 15b of the emitter PCB 15 and the photodiodes 16a, 16b, 16c of the detector PCB 16 to face the light passages 20d, 22d of the respective optic blocks. Moreover, the PCB alignment pins 26, 28 fix the position of the LEDs 15a, 15b and the photodiodes 16a, 16b, 16c relative to the center line of the shaft passages 34, 36 (and, thus, relative to the shaft 12).

The block alignment pins 44a, 46a align and mate together the two optic blocks 20, 22 by engaging the corresponding block alignment holes 44b, 46b of the other block. In addition, the block alignment pins 44a, 46a fix the position of the aperture plate 70 and the spacer block 80 which are sandwiched between the emitter optic block 20 and the detector optic block 22. Note that the configuration of the spacer block 80 (as shown in FIG. 1) permits the encoder wheel 60 to freely rotate. Similar to the PCB alignment pins 26, 28, the block alignment pins 44a, 46a fix the position of the optic blocks 20, 22, the aperture plate 70 and the spacer block 80 relative to the center line of the shaft passages 34, 36 (and, thus, relative to the shaft 12). The retainment screws 52, 54, which are held within the threaded apertures 48, 50, hold the two optic blocks 20, 22, the aperture plate 70 and the spacer block 80 securely together.

The PCB alignment pins 26, 28 and the block alignment pins 44a, 46a fix the positions of the various encoder elements relative to one another and, most importantly relative to the shaft 12. This creates and maintains a constant radial or rotational alignment among the elements that form the light pathway for the encoder 10, i.e., the emitter PCB 15, the detector PCB 16, the light passages 20d, 22d, the aperture plate 70 and the encoder wheel 60 (which is fixed to the shaft 12). As a result, the positions of the two PCBs 15, 16, the light passages 20d, 22d, the aperture plate 70 and the encoder wheel 60 are substantially unaffected by the speed or direction of rotation of the shaft 12. Further, this insures a positive alignment of the light pathway between the LEDs 15a, 15b and the photodiodes 16a, 16b, 16c.

Figure 3:
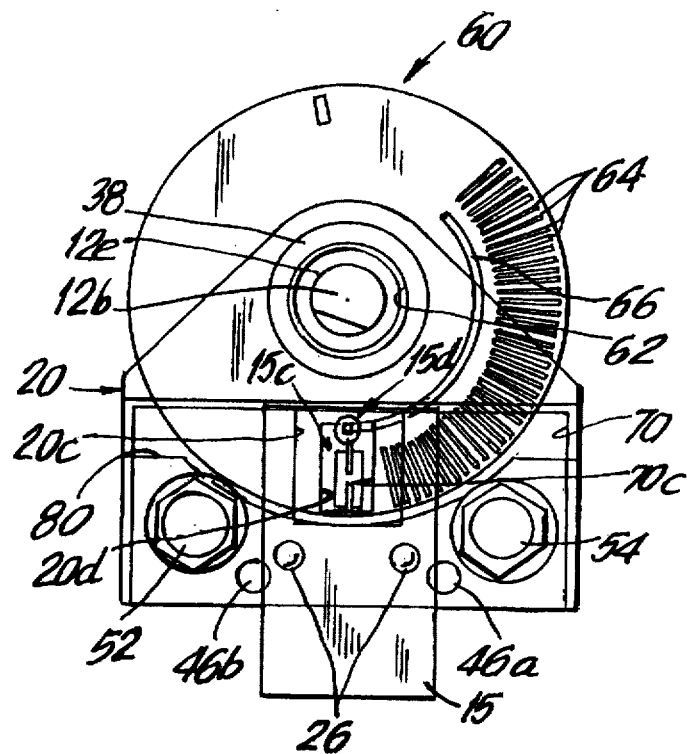
FIG. 3 is an end view of the optical encoder of FIG. 1.

FIG. 3 is an end view of the assembled encoder 10 with a transparent view of some of the elements. As noted above, upon assembly, the encoder elements are aligned so as to establish two light pathways between the emitter PCB 15 and the detector PCB 16. One light pathway is formed between the first LED 15a on the emitter PCB 15 and first and second photodiodes 16a, 16b on the detector PCB 16. This pathway constitutes the incremental counter channel, or the "A/B" channel. Radiation emitted by the first LED 15a is focused by the cylindrical lens 15c of the emitter PCB 15. The radiation then passes through the light passage 20d of the emitter optic block 20 and through first and second apertures 70c of the aperture plate 70, which are formed on the plate 70 approximately 0.75 degrees apart from each other. The aperture plate 70 is used to block certain unwanted radiation from the first LED 15a (and from the second LED 15b). The use of the first and second apertures 70c splits the radiation from the first LED 15a into two segments, an A channel segment and a B channel segment.

As detailed below, the radiation from the first aperture passes through the long slots 64 of the encoder wheel 60 (or the A/B channel slots 64) and falls incident onto the first photodiode 16a (or the A channel photodiode 16a) and the radiation from the second aperture passes through the A/B channel slots 64 and falls incident onto the second photodiode 16b (or the B channel photodiode 16b). Note that the A channel photodiode 16a and the B channel photodiode 16b are mounted 0.75 degrees apart from each other on the detector PCB 16 in the same pattern as the first and second apertures 70c of the aperture plate 70.

A second pathway is formed between the second LED 15b on the emitter PCB 15 and the third photodiode 16c on the detector PCB 16. This pathway is used to determine rotational displacement timing for the encoder 10 and constitutes the "C" channel. Radiation emitted by the second LED 15b is focused by the spherical lens 15d of the emitter PCB 15. The radiation then passes through the light passage 20d of the emitter optic block 20 and through the third aperture 70c of the aperture plate 70, which is located apart from the first and second apertures. The third aperture 70c allows passage therethrough of only certain radiation from the second LED 15b. The radiation from the third aperture passes through the curved slot 66 of the encoder wheel 60 (or the C channel slot 66) and falls incident onto the third photodiode 16c (or the C channel photodiode 16c). Note that the C channel photodiode 16c is mounted apart from the A and B channel photodiodes 16a, 16b in the same pattern as the third aperture is formed relative to the first and second apertures of the aperture plate 70.

In operation, the rotation of the shaft 12 causes the encoder wheel 60 to rotate at the same speed and direction. The remainder of the encoder 10 (i.e., the optic blocks 20, 22, the aperture plate 70 and the spacer block 80) remains stationary. The first and second LEDs 15a, 15b emit radiation upon the associated control circuitry on the emitter PCB 15 sensing the rotation of the shaft 12. Also, the A channel photodiode 16a and the B channel photodiode 16b output a low current signal to the receiver circuit 16d upon the associated control circuitry on the detector PCB 16 sensing the rotation of the shaft 12. The emitted radiation is focused by the respective lens 15c, 15d as described above and passes through the light passage 20d of the emitter optic block 20. The radiation from the first LED 15a then passes through the first and second apertures of the aperture plate 70 and the radiation from the second LED 15b passes through the third aperture 70c.

As the encoder wheel 60 rotates, a first A/B channel slot 64 in the encoder wheel 60 allows the radiation from the first aperture to pass therethrough and fall incident on the A channel photodiode 16a. In response to receiving the radiation, the A channel photodiode 16a outputs a high current signal to the receiver circuit 16d. The radiation from the second aperture is blocked by the opaque area of the encoder wheel 60. Consequently, the B channel photodiode 16b continues to output a low current signal. The radiation from the third aperture passes through the C channel slot 66 and falls incident on the C channel photodiode 16c. In response, the C channel photodiode 16c outputs a high current signal to the receiver circuit 16d.

As the encoder wheel 60 continues to rotate, the radiation from the first aperture becomes blocked by an opaque area on the encoder wheel 60. This causes the A channel photodiode 16a to output a low current signal since no radiation is received. At the same time, the radiation from the second aperture remains blocked and the B channel photodiode 16b continues to output a low current signal. In addition, the radiation from the third aperture continues to pass through the C channel slot 66, since no opaque areas interrupt the C channel slot 66, and the C channel photodiode 16c continues to output a high current signal.

When the encoder wheel 60 rotates 0.75 degrees, the radiation from the first aperture passes through a second A/B channel slot 64 and the A channel photodiode 16a outputs a high current signal. At the same time, the first A/B channel slot 64 allows the radiation of the second aperture to pass through the encoder wheel 60. As noted above, the A/B channel slots 64 are patterned on the encoder wheel 60 to coincide with the A channel photodiode 16a and the B channel photodiode 16b pattern on the detector PCB 16. Consequently, the radiation that passes through the first A/B channel slot 64 falls incident on the B channel photodiode 16b, which outputs a high current signal in response thereto. Further, the C channel photodiode 16c continues to output a high current signal.

As the shaft 12 and the encoder wheel 60 continue to rotate, the radiation from the first and second apertures become blocked again by opaque areas on the encoder wheel 60. This causes the A and B channel photodiodes 16a, 16b to output respective low current signals since no radiation is received. The C channel photodiode 16c continues to output a high current signal.

The interchanging of low and high current signals by the A channel photodiode 16a and the B channel photodiode 16b, and the high current output of the C channel photodiode 16c, continues until the encoder rotates its slot pattern past the light pathways. At that time, all the photodiodes 16a, 16b, 16c output low current signals to the receiver circuit 16d. The entire process then repeats with each succeeding shaft rotation.

The time difference in the high current signal outputs from the A channel photodiode 16a and the B channel photodiode 16b causes a phase shift between the two output signals. In particular, the A and B channel photodiodes 16a, 16b are patterned so that the output signal of the A channel photodiode 16a is 90 degrees out of phase with the output signal of the B channel photodiode 16b. This results in a quadrature output signal to the receiver circuit 16d as the shaft 12 rotates.

The output signals are used by the receiver circuit 16d to determine the speed and direction of the shaft 12 rotation. The output signals are also used to define reference points during each rotation for starting or stopping an operation or process, such as, braking the shaft, monitoring the period of rotation, resetting, etc. The receiver circuit 16d is configured depending upon on the application and comprises components that are normally found in control and timing circuitry, such as, counters, latch circuits, etc.

Figure 4:
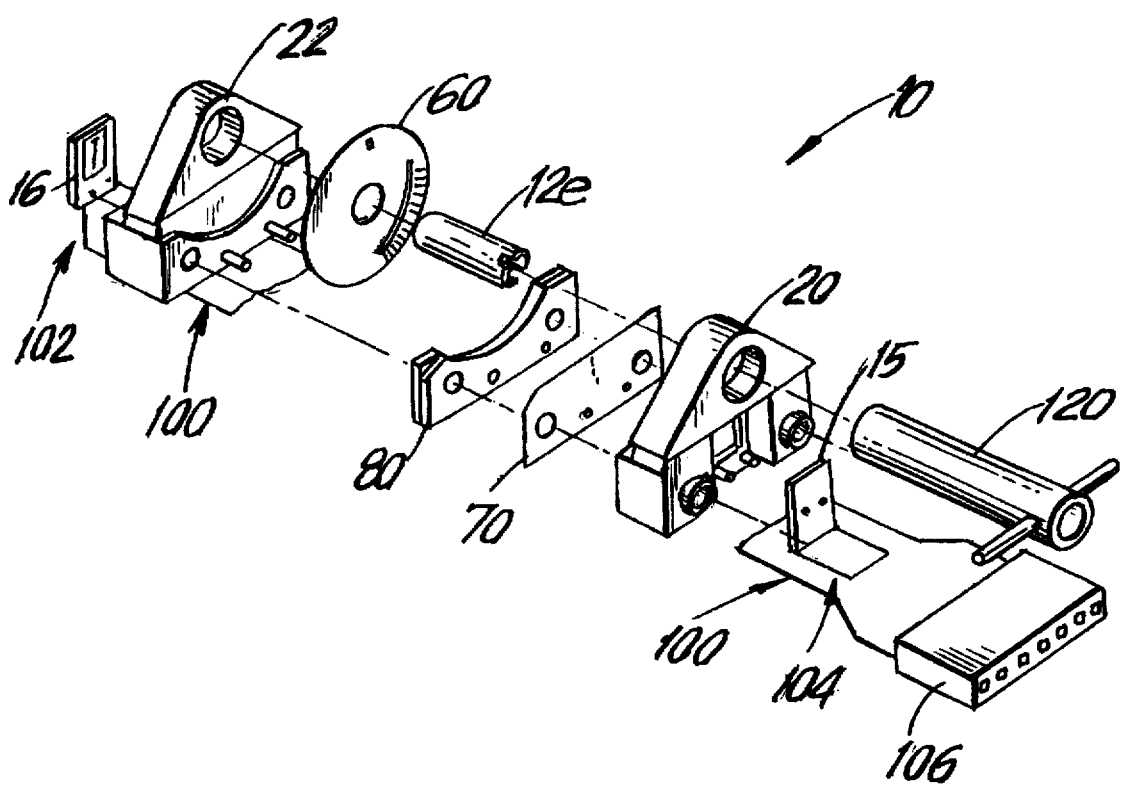
FIG. 4 is an exploded isometric view of an alternative optical encoder constructed in accordance with the present invention.

FIG. 4 shows an exploded isometric view of the optical encoder 10 with alternative configurations of certain of the components. For example, the emitter PCB 15 and the detector PCB 16 may be formed as part of a single flex circuit 100 rather than as two separate components. This would allow for ease of assembly and manufacturing of the encoder 10. In such case, one of the PCBs can be formed as a first end terminal 102 of the flex circuit 100 (e.g., the detector PCB 16 as shown) and the other PCB can be formed as a cut-out or flap 104 from the flex circuit 100 that can be folded into position on the respective block (e.g., the emitter PCB 15 as shown). The other end terminal 106 of the flex circuit 100 connects to the outside power and control circuitry of the motor or machine. As shown, the flex circuit 100 underlies the other components of the encoder 10 so as not to disrupt the operation of the encoder 10. With the use of such a flex circuit 100, the use of actual printed circuit board substrates may be unnecessary as the LEDs 15a, 15b and the photodiodes 16a, 16b, 16c, and the associated circuitry, may be formed directly on the flex circuit 100 itself.

Second, the optic blocks 20, 22 may be configured with shaft passages 34, 36 formed therethrough that do not hold therein respective precision linings or bushings 38, 40. Instead, the optic blocks 20, 22 may utilize an alignment tool 120 in order to align and maintain the center lines of the respective shaft passages 34, 36 coincident with the center line of the shaft 12. The tool 120 is inserted through the shaft passages 34, 36 and fit over the shaft 12, that is also inserted in the passages 34, 36, prior to the tightening of the retainment screws 52, 54. The tool 120 is then extracted after the retainment screws 52, 54 are tightened and optical alignment achieved. The alignment tool 120 is a precision-ground, hardened element that can be of any configuration. Even with the use of the alignment tool 120, the shaft passages 34, 36 are still configured to provide a tight fitting of the shaft 12 and to be constructed with wear-resistant and low-friction material (for example, via overlaying).

The embodiments described herein are merely illustrative of the principles of the present invention. Various modifications may be made thereto by persons ordinarily skilled in the art, without departing from the scope or spirit of the invention. For example, the encoder 10 may be implemented as a through-shaft encoder, or any other construction style, rather than a single-ended shaft encoder as described above. Further, the shaft 12 may be configured to be a element of the encoder 10 itself. In such case, the encoder 10 would be required to be linked to the shaft that is to be measured. Also, the shaft 12 and the shaft sections may be of any cross-sectional shape other than circular and may even have different cross-sectional shapes from one another. Also, the optic blocks 20, 22 may be formed to be identical in size, shape and face configuration. Also, the shaft passages 34, 36 are shown to be circular but may be of any shape to properly engage the shaft 12.

What is claimed is:

1. An encoder for a rotating shaft, comprising:
   (a) a radiation source including a first light-emitting diode and a second light-emitting diode which create, respectively, a first high-flux-density radiation pattern and a second high-flux-density radiation pattern, said first and second radiation patterns being axially aligned with said rotating shaft;
   (b) a radiation detector, said detector including a first photodiode channel and a second photodiode channel, said first channel detecting substantially only said first pattern and said second channel detecting substantially only said second pattern, said channels being configured so that an output signal of said first channel is out of phase with an output signal of said second channel and a quadrature signal is output; and (c) a radiation modulator interposed between the source and the detector, said source, detector and modulator being axially aligned with one another.

2. The encoder of claim 1, wherein the source, the detector and the modulator are aligned relative to one reference datum.

3. The encoder of claim 1, wherein the modulator is mechanically coupled to the rotating shaft and the source and the detector are mechanically coupled to one another, said couplings fixing the positions of the source, the modulator and the detector relative to one reference datum.

4. The encoder of claim 1, wherein the source, the detector and the modulator are aligned relative to a longitudinal alignment tool.

5. The encoder of claim 4 wherein said longitudinal alignment tool is removable after said source, detector, and modulator are aligned and before operation of said encoder.

6. An encoder for a rotating shaft, comprising:

(a) a radiation source including a first light-emitting diode and a second light-emitting diode which create, respectively, a first high-flux-density radiation pattern and a second high-flux-density radiation pattern, said first and second radiation patterns being axially aligned with said rotating shaft;

(b) a radiation detector, said detector including a first photodiode channel and a second photodiode channel, said first channel detecting substantially only said first pattern and said second channel detecting substantially only said second pattern, said first and second channels being configured so that an output signal of a first channel is out of phase with an output signal of a second channel and a quadrature signal is output; and (c) a radiation modulator interposed between the source and the detector and coupled to the rotating shaft, the source and the detector being coupled so that there is a substantial axial alignment therebetween relative to the shaft, and so that the source, the detector and the modulator are in substantial radial alignment with one another relative to the shaft.

7. The encoder of claim 6, wherein the radiation source comprises a radiation emitter and a first block configured to receive the rotating shaft and to hold the radiation emitter, and the radiation detector comprises a radiation sensor and a second block configured to receive the rotating shaft and to hold the radiation sensor.

8. The encoder of claim 7, wherein each of the blocks has a passage formed therethrough to receive the rotating shaft so as to align and maintain the axis of the respective shaft passage substantially coincident with the axis of the rotating shaft.

9. The encoder of claim 7, wherein each of the blocks has a passage formed therethrough configured to fixedly hold therein a bushing, said bushing configured to receive the rotating shaft so as to align and maintain the axis of the respective shaft passage substantially coincident with the axis of the rotating shaft.

10. The encoder of claim 7, wherein the radiation modulator comprises an encoder disk that has a center passage formed therethrough configured to receive and fixedly hold the rotating shaft so that the disk rotates synchronously with the shaft, the center axis of the disk being substantially coincident with the axis of the rotating shaft.

11. The encoder of claim 7, wherein the blocks hold the radiation emitter and the radiation sensor in corresponding locations on the respective blocks so that the emitter and the sensor are in direct alignment with one another.

12. The encoder of claim 7, wherein the blocks hold the radiation emitter and the radiation sensor in corresponding locations on the respective blocks so that the emitter and the sensor are aligned relative to the axis of the rotating shaft.

13. The encoder of claim 7, wherein the blocks have corresponding pins and holes formed thereon that enable the blocks to mate together.

14. The encoder of claim 13, wherein the blocks comprise means for securely maintaining the blocks mated together.

15. The encoder of claim 7, wherein the blocks are configured to be mated together so as to align and fix the rotational positions of the emitter, the sensor and the modulator relative to the axis of the rotating shaft.

16. The encoder of claim 7, wherein the radiation modulator comprises an encoder disk that has a center passage formed therethrough configured to receive and fixedly hold the rotating shaft, the center axis of the disk being substantially coincident with the axis of the rotating shaft, and a collimator, the blocks and the collimator being configured to be mated together so as to align and fix the rotational positions of the emitter, the sensor, the encoder disk, and the collimator relative to the axis of the rotating shaft.

17. The encoder of claim 16, wherein the blocks have corresponding pins and holes formed thereon that enable the blocks to mate together and the collimator is configured to receive the pins so as to enable the collimator to be coupled to the blocks.

18. The encoder of claim 16, wherein the blocks hold the radiation emitter and the radiation sensor in corresponding locations on the respective blocks so that the emitter and the sensor are in direct alignment with one another and with the encoder disk and the collimator.

19. The encoder of claim 16, wherein the collimator comprises an aperture plate having apertures formed therethrough, the rotational positions of the apertures being aligned and fixed relative to the axis of the rotating shaft.

20. In combination, (a) a rotating shaft of a machine and (b) an optical encoder that has a light source including a first light-emitting diode and a second light-emitting diode which create, respectively, a first high-flux-density radiation pattern and a second high-flux-density radiation pattern, said first and second radiation patterns being axially aligned with said rotating shaft, a light sensor, a first block that holds the light source and through which the shaft passes, a second block that holds the light sensor and through which the shaft passes, said sensor including a radiation detector with a first photodiode channel and a second photodiode channel, said first channel detecting substantially only said first pattern and said second channel detecting substantially only said second pattern, said first and second channels being configured so that an output signal of a first channel is out of phase with an output signal of a second channel, so that a quadrature signal is output, and an encoder disk that is interposed between the light source and the light sensor and that couples to the shaft, said blocks being coupled so as to cause the light pathway formed between the source, the encoder disk and the sensor to be in substantial axial alignment with the shaft.

21. The combination of claim 20, wherein the blocks are mated together so as to cause the source, the sensor and the encoder wheel to be in substantial radial alignment with one another relative to the shaft.

22. The combination of claim 20, wherein the blocks are mated together so as to maintain the light pathway as continuous.

23. The combination of claim 20, wherein each of the blocks has a passage formed therethrough that is configured to receive the rotating shaft so as to align and maintain the axis of the respective shaft passage substantially coincident with the axis of the rotating shaft.

24. The combination of claim 20, wherein each of the blocks has a passage formed therethrough that is configured to fixedly hold therein a bushing, said bushing configured to receive the rotating shaft so as to align and maintain the axis of the respective shaft passage substantially coincident with the axis of the rotating shaft.

25. The combination of claim 20, wherein the blocks hold the source and the sensor in corresponding locations on the respective blocks so that the source and the sensor are aligned relative to the axis of the rotating shaft.

26. An encoder for a rotating shaft, comprising:
   (a) a radiation source including two light-emitting diodes which create two distinct high-flux-density radiation patterns, said radiation source defining a first plane that is substantially perpendicular to a direction of radiation emission;
   (b) a radiation detector, said radiation detector defining a second plane that is substantially perpendicular to a direction of radiation reception;
   (c) a radiation modulator, said radiation modulator defining a third plane that is substantially perpendicular to a direction of radiation propagation;
   (d) a first block; and
   (e) a second block,
   wherein said radiation source is secured to said first block in a fixed alignment,
   wherein said radiation detector is secured to said second block in a fixed alignment,
   wherein said first block is secured to said second block so that said first plane is substantially parallel to said second plane and so that said directions of radiation emission and reception are substantially collinear,
   wherein said radiation modulator is coupled to said rotating shaft, securing said modulator in a substantially constant radial alignment relative to said shaft, said third plane being substantially perpendicular to a rotational axis of said shaft, and
   wherein said first and second blocks are coupled to said shaft in a manner that allows said shaft to rotate, independent of said first and second blocks, with said first plane and said second plane being substantially parallel with said third plane, and with said direction of radiation propagation being substantially collinear with said directions of radiation emission and reception.

27. The encoder of claim 26, wherein said first block defines a first shaft passage, said second block defines a second shaft passage, and said rotating shaft extends into said first and second shaft passages, said first and second shaft passages fitting tightly around said shaft, securing said shaft while allowing said shaft to rotate.

* * * * *